(12) United States Patent
Chen

(10) Patent No.: US 10,930,717 B2
(45) Date of Patent: Feb. 23, 2021

(54) DISPLAY PANEL AND METHOD FOR MANUFACTURING SAME

(71) Applicant: Wuhan China Star Optoelectronics Semiconductor Display Technology Co., Ltd., Wuhan (CN)

(72) Inventor: Zhe Chen, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 146 days.

(21) Appl. No.: 16/317,572

(22) PCT Filed: Sep. 25, 2018

(86) PCT No.: PCT/CN2018/107409
§ 371 (c)(1),
(2) Date: Jan. 14, 2019

(87) PCT Pub. No.: WO2020/042261
PCT Pub. Date: Mar. 5, 2020

(65) Prior Publication Data
US 2020/0119112 A1 Apr. 16, 2020

(30) Foreign Application Priority Data
Aug. 31, 2018 (CN) .......................... 201811015618.X

(51) Int. Cl.
*H01L 51/00* (2006.01)
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 51/0011* (2013.01); *H01L 51/5209* (2013.01); *H01L 51/5215* (2013.01); *H01L 51/56* (2013.01); *H01L 2227/323* (2013.01)

(58) Field of Classification Search
CPC ............. H01L 27/3246; H01L 27/3258; H01L 51/0011; H01L 51/5209
USPC ........................................................ 257/40
See application file for complete search history.

(56) References Cited

U.S. PATENT DOCUMENTS

| | | |
|---|---|---|
| 2018/0006259 A1 | 1/2018 | Paek et al. |
| 2018/0190944 A1 | 7/2018 | Lee et al. |
| 2018/0226458 A1 | 8/2018 | Bai et al. |
| 2018/0226508 A1 | 8/2018 | Chen |

(Continued)

FOREIGN PATENT DOCUMENTS

| | | |
|---|---|---|
| CN | 106601778 | 4/2017 |
| CN | 106653768 | 5/2017 |

(Continued)

*Primary Examiner* — Elias Ullah

(57) ABSTRACT

The present disclosure provides a display panel and method for manufacturing same. The method for manufacturing the display panel includes providing an array substrate, wherein a source/drain metal is disposed on the array substrate; sequentially forming a planarization layer and a pixel defining layer on the array substrate, wherein the pixel defining layer comprises a plurality of pixel defining bodies that are spaced apart from each other, and a region located between any two adjacent pixel defining bodies constitutes a pixel area; and forming an anode layer in the pixel area, wherein an edge of the anode layer is attached to the pixel defining layer.

8 Claims, 5 Drawing Sheets

(56) References Cited

U.S. PATENT DOCUMENTS

2018/0366496 A1 12/2018 Li
2019/0245019 A1 8/2019 Paek et al.

FOREIGN PATENT DOCUMENTS

| CN | 107424957 | 12/2017 |
| CN | 107565034 | 1/2018 |
| CN | 108269943 | 7/2018 |
| CN | 108281459 | 7/2018 |

DISPLAY PANEL AND METHOD FOR MANUFACTURING SAME

RELATED APPLICATIONS

This application is a National Phase of PCT Patent Application No. PCT/CN2018/107409 having International filing date of Sep. 25, 2018, which claims the benefit of priority of Chinese Patent Application No. 201811015618.X filed on Aug. 31, 2018. The contents of the above applications are all incorporated by reference as if fully set forth herein in their entirety.

FIELD AND BACKGROUND OF THE INVENTION

The present disclosure relates to field of display technology, and more particularly to a display panel and a method for manufacturing same.

Organic light-emitting diode (OLED) displays, differing from liquid crystal displays (LCDs), do not include backlight modules. Instead, OLED displays could emit light by itself. OLED displays include organic material films and glass substrates, where organic material films emit light once electrical currents are applied thereto. In addition, OLED displays have outstanding properties, such as being thin, having light weight, being portable, having wide viewing angles, and being energy-saving, therefore OELD displays gradually draw market's attention.

Please refer to FIG. 1. In conventional OELD display panels, a planarization layer 12, an anode layer 13, a pixel defining layer 14, and a support layer are disposed on an array substrate 11. Anode layer 13 is surrounded by pixel defining layer 14 to form an opening area. Size of opening in pixel defining layer 14 determines hole size where light emitted from organic light-illumination layer that is disposed on anode layer 13 passes through. However, in a process for manufacturing conventional OELD display panels, an opening formed in pixel defining layer 14 does not match size of anode layer 13. In case size of opening in pixel defining layer 14 is too large, it is easy for silver metal inside of anode layer 13 to be corroded, thus damaging anode layer 13. In case size of opening in pixel defining layer 14 is too small, edge of anode layer 13 would be wrapped by pixel defining layer 14, thus resulting in reduction of effective light-illumination area, and resulting in a decrease of an aperture ratio of pixels in display panels.

Therefore, there is a need to provide a display panel and method for manufacturing same, in order to solve above-said problems existing in prior art.

SUMMARY OF THE INVENTION

The present disclosure provides a display panel and a method for manufacturing same in order to solve problems existing in prior art, where pixel defining layer covers edge of anode layer, or aperture ratio of pixels in display panels is reduced even though anode layer is avoided from being corroded In a first aspect, the present disclosure provides a method for manufacturing a display panel, comprising:

a step S10 of providing an array substrate, wherein a source/drain metal is disposed on the array substrate;

a step S20 of sequentially forming a planarization layer and a pixel defining layer on the array substrate, wherein the pixel defining layer comprises a plurality of pixel defining bodies that are spaced apart from each other, and a region located between any two adjacent pixel defining bodies constitutes a pixel area; and a step S30 of forming an anode layer in the pixel area, wherein the anode layer comprises a first transparent electrode layer, a silver metal layer, and a second transparent electrode layer, and an edge of the anode layer is attached to the pixel defining layer;

wherein the planarization layer comprises a through-hole in the planarization layer, and the anode layer is electrically connected to the source/drain metal via the through-hole.

In one preferred embodiment of the present disclosure, the step S30 comprises:

forming an anode metal layer in the pixel area, and performing an exposure treatment, a developing treatment, and an etching treatment to the anode metal layer using a mask process in order to form the anode layer.

In one preferred embodiment of the present disclosure, the anode layer comprises an upward protruding portion, and the upward protruding portion is located at a position where the anode layer is attached to the pixel defining layer.

In one preferred embodiment of the present disclosure, the pixel defining bodies comprise a slope at a side of the pixel defining bodies that is adjacent to the pixel area.

In one preferred embodiment of the present disclosure, the step S20 further comprises forming a support layer on the pixel defining layer, and the planarization layer, the pixel defining layer, and the support layer all comprise a photoresist material; and the planarization layer, the pixel defining layer, and the support layer are formed simultaneously using a same mask.

In a second aspect, the present disclosure provides a method for manufacturing a display panel, comprising:

a step S10 of providing an array substrate, wherein a source/drain metal is disposed on the array substrate;

a step S20 of sequentially forming a planarization layer and a pixel defining layer on the array substrate, wherein the pixel defining layer comprises a plurality of pixel defining bodies that are spaced apart from each other, and a region located between any two adjacent pixel defining bodies constitutes a pixel area; and a step S30 of forming an anode layer in the pixel area, wherein an edge of the anode layer is attached to the pixel defining bodies.

In one preferred embodiment of the present disclosure, the step S30 comprises:

forming an anode metal layer in the pixel area, and performing an exposure treatment, a developing treatment, and an etching treatment to the anode metal layer using a mask process in order to form the anode layer.

In one preferred embodiment of the present disclosure, the anode layer comprises an upward protruding portion, and the upward protruding portion is located at a position where the anode layer is attached to the pixel defining layer.

In one preferred embodiment of the present disclosure, the pixel defining bodies comprise a slope at a side of the pixel defining bodies that is adjacent to the pixel area.

In one preferred embodiment of the present disclosure, the step S20 further comprises forming a support layer on the pixel defining layer, and the planarization layer, the pixel defining layer, and the support layer all comprise a photoresist material; and the planarization layer, the pixel defining layer, and the support layer are formed simultaneously using a same mask.

In a third aspect, the present disclosure provides a display panel, comprising:

an array substrate including a source/drain metal;

a planarization layer disposed on the array substrate;

a pixel defining layer disposed on the planarization layer, wherein the pixel defining layer comprises a plurality of pixel defining bodies that are spaced apart from each other, and a region located between any two adjacent pixel defining bodies constitutes a pixel area; and an anode layer disposed in the pixel area, wherein an edge of the anode layer is attached to the pixel defining layer.

In one preferred embodiment of the present disclosure, the anode layer comprises an upward protruding portion, the upward protruding portion is located at a position where the anode layer is attached to the pixel defining layer, and the upward protruding portion is configured for avoiding inside of the anode layer from corrosion.

In one preferred embodiment of the present disclosure, the pixel defining bodies comprise a slope at a side of the pixel defining bodies that is adjacent to the pixel area, and the edge of the anode layer is attached to the slope of the pixel defining bodies.

In one preferred embodiment of the present disclosure, the anode layer comprises a first transparent electrode layer, a silver metal layer and a second transparent electrode layer.

In one preferred embodiment of the present disclosure, the planarization layer comprises a through-hole in the planarization layer, and the anode layer is electrically connected to the source/drain metal via the through-hole.

In one preferred embodiment of the present disclosure, the planarization layer, the pixel defining layer, and the support layer all comprise a photoresist material.

According to the present disclosure, the anode layer is formed after the planarization layer and the pixel defining layer are formed, therefore the edge of the anode layer is attached to the pixel defining layer. Therefore, not only can the anode layer be avoided from being corroded, but aperture ratio of pixels in display panel is increased.

DETAILED DESCRIPTION OF SPECIFIC EMBODIMENTS OF THE INVENTION

Figure 1:
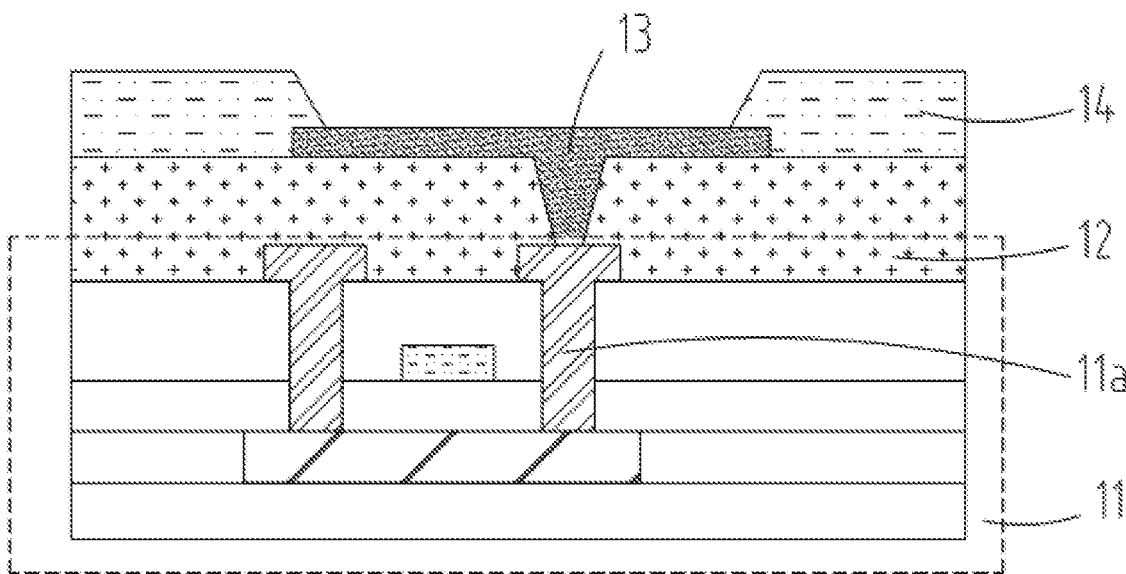
FIG. 1 shows a cross-sectional view of a structure of a display panel according to the prior art.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 2:
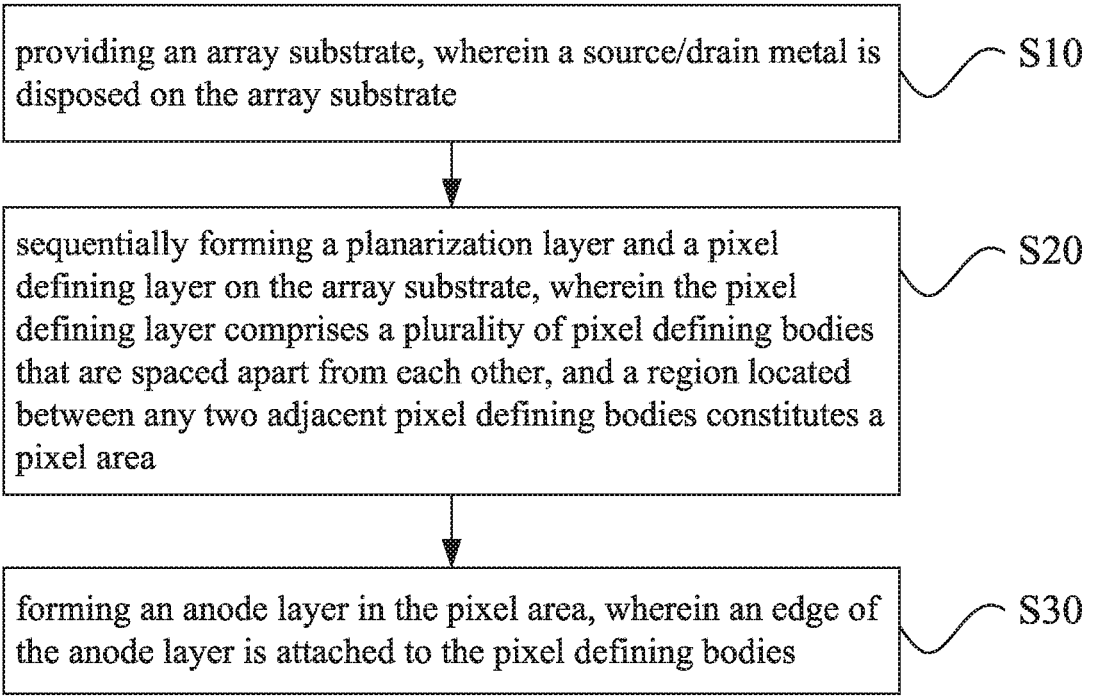
FIG. 2 shows a flowchart of a method for manufacturing a display panel according to one embodiment of the present disclosure.
Figure 3:
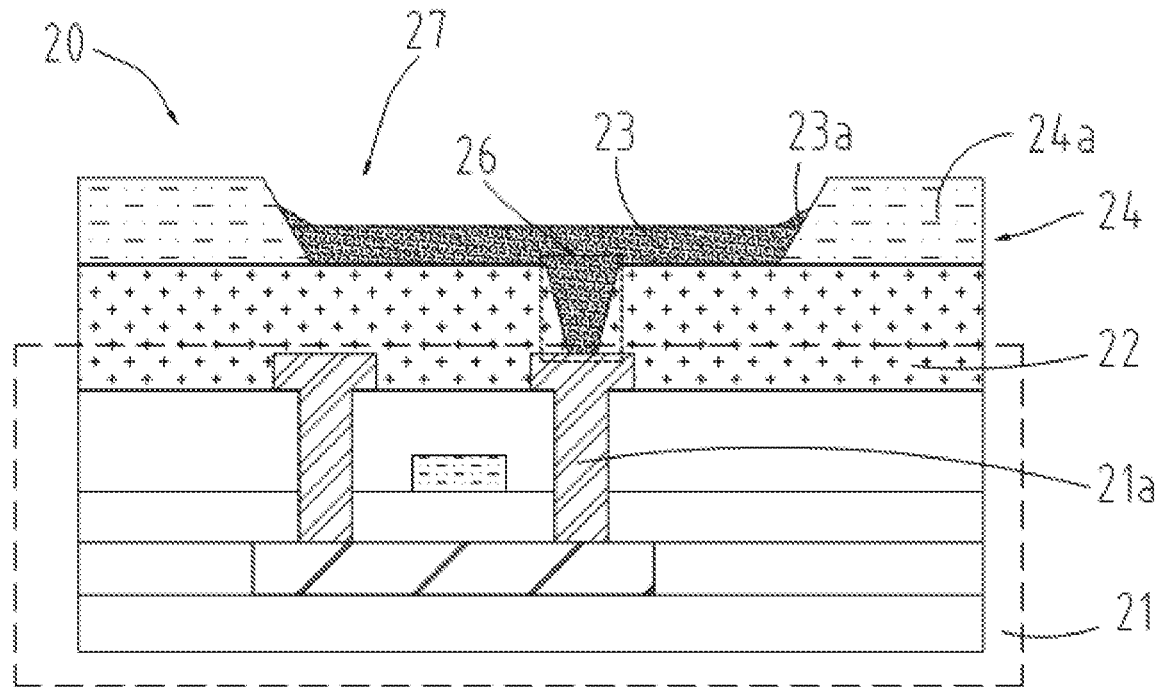
FIG. 3 shows a cross-sectional view of a structure of a display panel according to one embodiment of the present disclosure.
Figure 4A:
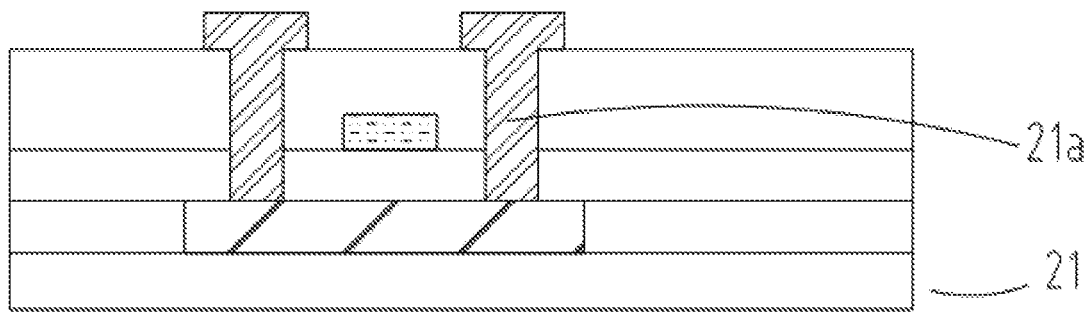
FIGS. 4A, 4B, and 4C show each stage in a process flow of a method for manufacturing a display panel according to one embodiment of the present disclosure.
Figure 4B:
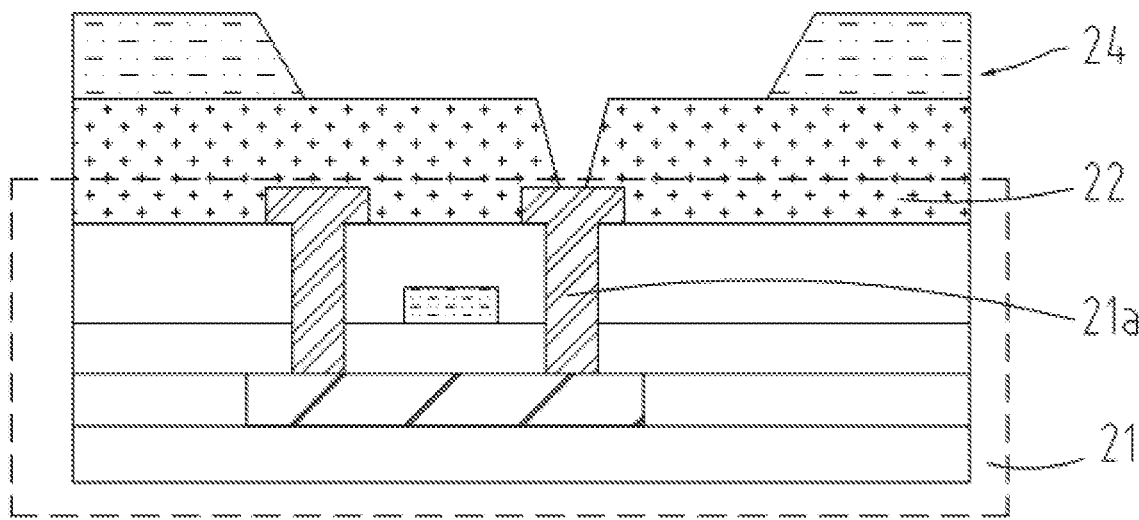
Figure 4C:
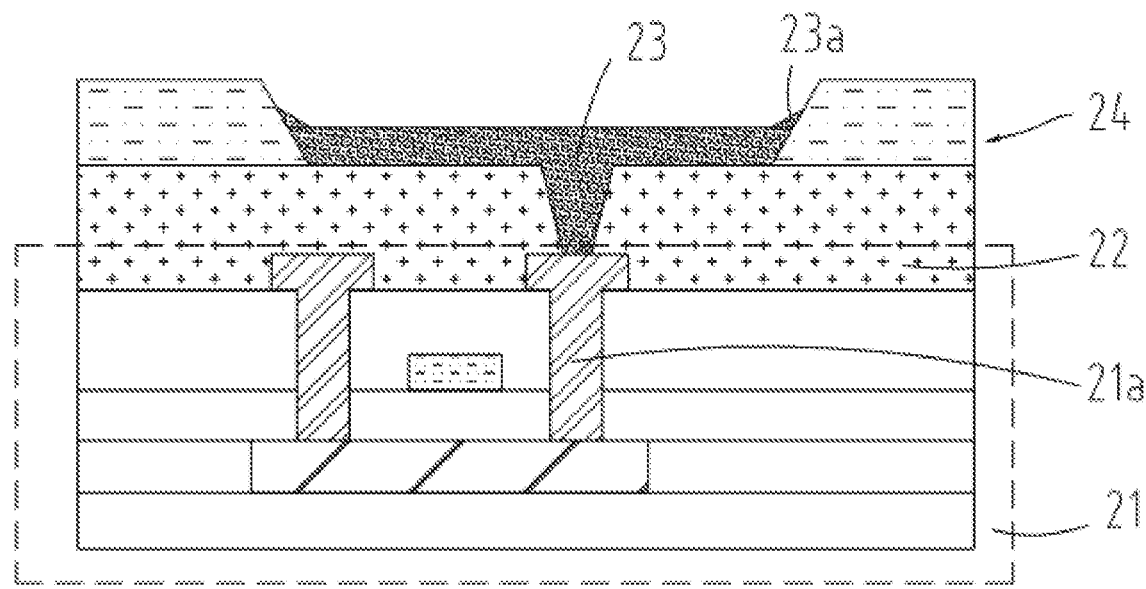

The present disclosure provides a display panel and a method for manufacturing same in order to solve problems existing in prior art, where pixel defining layer covers edge of anode layer, or aperture ratio of pixels in display panels is reduced even though anode layer is avoided from being corroded Please refer to FIG. 2, and FIGS. 4A, 4B, and 4C. FIG. 2 shows a flowchart of a method for manufacturing a display panel according to one embodiment of the present disclosure. FIGS. 4A, 4B, and 4C shows each stage in a process flow of a method for manufacturing a display panel according to one embodiment of the present disclosure.

In one aspect, the present disclosure provides a method for manufacturing a display panel 20. The method includes the following steps.

Please refer to FIG. 4A. In a step S10, an array substrate 21 is provided, wherein a source/drain metal 21*a* that is electrically connected to an anode layer 23 is disposed on the array substrate 21.

In one embodiment, the array substrate 21 includes a baseplate and an array of thin film transistors (TFTs). The source/drain metal 21*a* mentioned in the present disclosure is a part of TFT.

In one embodiment, TFTs of the array substrate 21 could be a single gate TFT or a double gate TFT. Specific structures of TFTs could be ascertained based on different needs.

Please refer to FIG. 4B. In a step S20, a planarization layer 22 and a pixel defining layer 24 are sequentially formed on the array substrate 21, wherein the pixel defining layer 24 comprises a plurality of pixel defining bodies 24*a* that are spaced apart from each other.

The pixel defining bodies 24*a* define a pixel area 27 where the anode layer 23 is disposed. A region located between any two adjacent pixel defining bodies 24*a* constitutes the pixel area 27. The pixel area 27 is the area that is surrounded by the pixel defining bodies 24*a*.

According to the prior art, where the anode layer 23 is formed first, and then the pixel defining layer 22 is formed later, it is difficult to control opening in the pixel defining layer 24. Moreover, the pixel defining layer 24 covers edge of the anode layer 23, therefore the portion disposed directly above the anode layer becomes an ineffective light-illumination area. This reduces aperture ratio of pixels in display panel because aperture ratio of pixels in display panel is related to size of opening in the pixel defining layer 24.

According to the present disclosure, the pixel defining layer 24 is formed first, and then the anode layer 23 is formed later, opening in the pixel defining layer 24 has a size that is the same as the size of the anode layer 23. Therefore, according to the present disclosure, aperture ratio of pixels in display panel would not be decreased for the reason that the pixel defining layer 24 covers the anode layer 23.

In one embodiment, the step S20 further comprises forming a support layer 25 on the pixel defining layer 24, and the planarization layer 22, the pixel defining layer 24, and the support layer 25 all comprise a photoresist material.

In one embodiment, the photoresist material is polyimide.

The planarization layer 22, the pixel defining layer 24, and the support layer 25 are formed simultaneously using a same mask.

Figure 5:
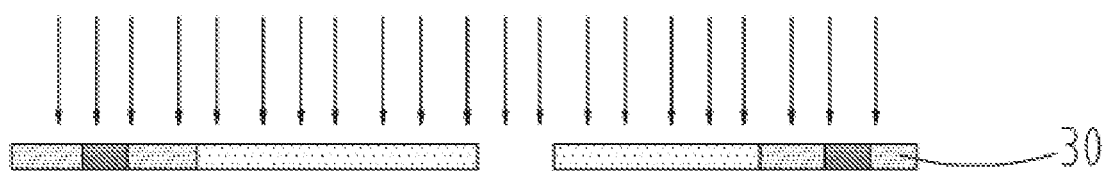
FIG. 5 shows a structure of a mask used to form a display panel according to the present disclosure.
Figure 5:
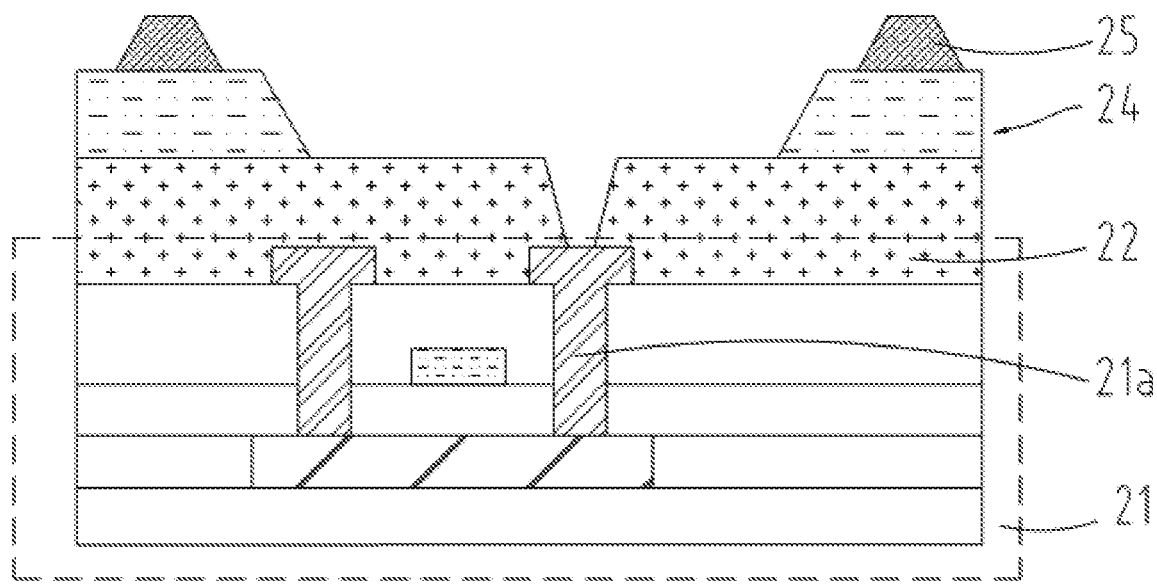

Please refer to FIG. 5, which shows a structure of a mask used to form a display panel according to the present disclosure.

In one embodiment, the mask 30 used to form the display panel is a multi-tone mask. The multi-tone mask includes a plurality of areas having different light transparencies. In the present embodiment, three areas having different light transparencies are included in the mask. This results in different degrees of chemical reactions occurring in photoresist layer underneath the mask 30. Therefore, multiple patterning etching effects are achieved in a single time.

The area having light transparency of 0%-30% is configured to form the support layer 25. The area having light transparency of 30%-60% is configured to form the pixel defining layer 24. The area having light transparency of 100% is configured to form the through-hole in the planarization layer 22.

In one embodiment, the photoresist layer is the layer collectively constituted by the support layer 25, the pixel defining layer 24, and the planarization layer 22.

According to the present disclosure, the planarization layer 22, the pixel defining layer 24, and the support layer 25 are made of photoresist material. In addition, the support layer 25 and the pixel defining layer 24 are formed first, and then the anode layer 23 is formed later. The planarization layer 22, the pixel defining layer 24, and the support layer 25 are formed simultaneously using a same mask. Therefore, according to the present disclosure, one mask process is omitted, and manufacturing efficiency of display panels is increased.

In one embodiment, the planarization layer 22, the pixel defining layer 24, and the support layer 25 all comprise a photoresist material.

In one embodiment, a through-hole is formed in the planarization layer 22, and the anode layer 22 is electrically connected to the source/drain metal 21a via the through-hole.

Please refer to FIG. 4C. In a step S30, an anode layer 23 is formed in the pixel area, wherein an edge of the anode layer 23 is attached to the pixel defining layer 24.

In one embodiment, the pixel area 27 is the area that is surrounded by the pixel defining bodies 24a. Size of opening in the pixel defining layer 24 determines aperture ratio of pixels in the display panel 20.

In one embodiment, the anode layer 23 comprises a first transparent electrode layer, a silver metal layer, and a second transparent electrode layer. Since it is easy for silver metal in the anode layer 23 to be corroded once exposed to air, there are two ways that are generally utilized to avoid silver metal from being corroded.

The first way is to have the pixel defining layer 24 cover edge of the anode layer 23. The second way is to have the anode layer 23 attach to the pixel defining layer 24. The present disclosure adopts the second way to prevent the portion disposed directly above the anode layer 23 from becoming an ineffective light-illumination area.

In one embodiment, the pixel defining bodies 24a comprise a slope at a side of the pixel defining bodies that is adjacent to the pixel area.

In one embodiment, the step S30 comprises forming an anode metal layer in the pixel area, and performing an exposure treatment, a developing treatment, and an etching treatment to the anode metal layer using a mask process in order to form the anode layer.

Please note that, as the pixel defining bodies 24a comprise a slope at a side of the pixel defining bodies that contacts the anode layer 23, the photoresist material at edge of the anode layer 23 would not be completely exposed and developed when the anode layer 23 is patterned. This leads to remaining of the photoresist material at this site. Thus, an upward protruding portion 23a is ultimately formed at edge of the anode layer 23. The upward protruding portion 23 is located at the position where the anode layer 23 is attached to the pixel defining layer.

The upward protruding portion 23a strengthens attachment between the anode layer 23 and the pixel defining bodies 24a, and thus avoids the anode layer 23 from being corroded. Therefore, according to the present disclosure, the pixel defining layer 24 is formed first, and then the anode layer 23 is formed later. Such design not only increases aperture ratio of pixels in display panels 20 but avoids the anode layer 23 from being corroded without additional process and equipment.

It is understood that, the method for manufacturing the display panel 20 further includes other steps for forming other elements in addition to the anode layer. Since such other steps are not essential steps of the present disclosure, details related thereto are omitted herein.

Figure 6:
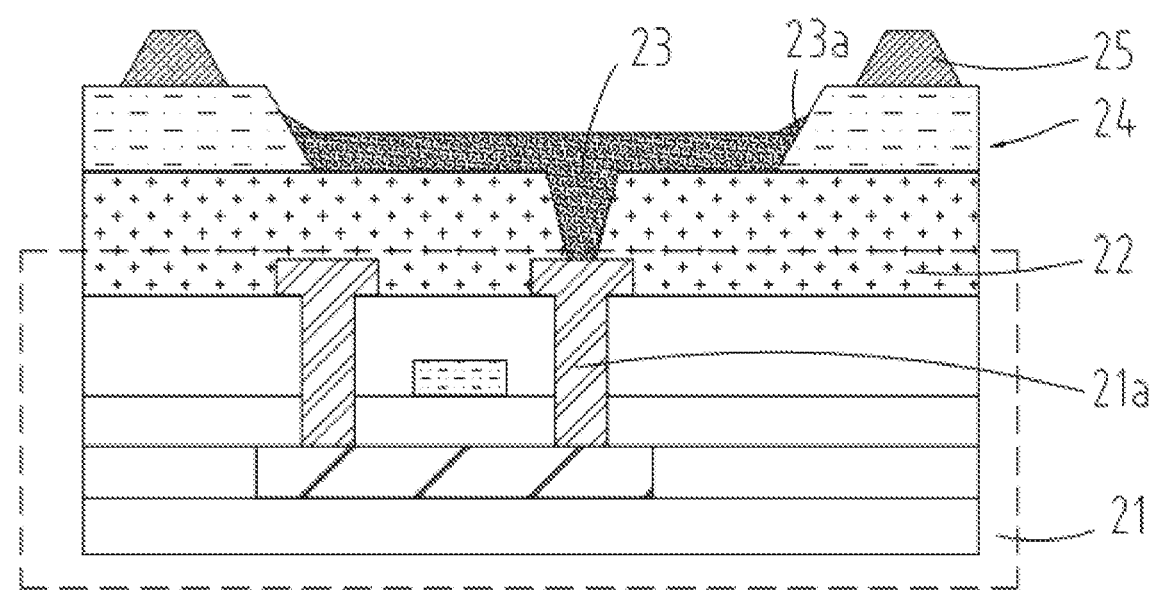
FIG. 6 shows a cross-sectional view of a structure of a display panel according to another embodiment of the present disclosure.

Please refer to FIG. 6. In another aspect, the present disclosure provides a display panel 20. The display panel 20 comprises:
    an array substrate 21 including a source/drain metal 21a that is electrically connected to the anode layer 23;
    a planarization layer 22 disposed on the array substrate 21;
    a pixel defining layer 24 disposed on the planarization layer 22, wherein the pixel defining layer 24 comprises a plurality of pixel defining bodies 24a that are spaced apart from each other, and a region located between any two adjacent pixel defining bodies 24a constitutes a pixel area; and
    an anode layer 23 disposed in the pixel area, wherein an edge of the anode layer 23 is attached to the pixel defining layer.

In one embodiment, the anode layer 23 comprises an upward protruding portion 23a. The upward protruding portion 23a is located at a position where the anode layer 23 is attached to the pixel defining layer 24, and the upward protruding portion is configured for avoiding inside of the anode layer 23 from corrosion.

In one embodiment, the pixel defining bodies 23a comprise a slope at a side of the pixel defining bodies 23a that is adjacent to the pixel area, and the edge of the anode layer 23 is attached to the slope of the pixel defining bodies 23a.

In the embodiment, the anode layer 23 is attached to the pixel defining layer 24. Size of opening in the pixel defining layer is increased, and the anode layer is avoided from being corroded. Thus, quality of display panel is raised.

According to the present disclosure, the anode layer is formed after the planarization layer and the pixel defining layer are formed, therefore the edge of the anode layer is attached to the pixel defining layer. Therefore, not only can the anode layer be avoided from being corroded, but aperture ratio of pixels in display panel is increased.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a display panel, comprising:
    a step S10 of providing an array substrate, wherein a source/drain metal is disposed on the array substrate;
    a step S20 of sequentially forming a planarization layer and a pixel defining layer on the array substrate, wherein the pixel defining layer comprises a plurality of pixel defining bodies that are spaced apart from each other, and a region located between any two adjacent pixel defining bodies constitutes a pixel area; and after forming the pixel defining layer, a step S30 of forming an anode layer in the pixel area, wherein the anode layer comprises a first transparent electrode layer, a silver metal layer, and a second transparent electrode layer, and an edge of the anode layer is attached to the pixel defining layer;

wherein the planarization layer comprises a through-hole in the planarization layer, and the anode layer is electrically connected to the source/drain metal via the through-hole; and wherein the anode layer comprises an upward protruding portion, and the upward protruding portion is located at a position where the anode layer is attached to the pixel defining layer.

2. The method for manufacturing the display panel according to claim 1, wherein the step S30 comprises:

forming an anode metal layer in the pixel area, and performing an exposure treatment, a developing treatment, and an etching treatment to the anode metal layer using a mask process in order to form the anode layer.

3. The method for manufacturing the display panel according to claim 1, wherein the pixel defining bodies comprise a slope at a side of the pixel defining bodies that is adjacent to the pixel area.

4. The method for manufacturing the display panel according to claim 1, wherein the step S20 further comprises forming a support layer on the pixel defining layer, and the planarization layer, the pixel defining layer, and the support layer all comprise a photoresist material; and wherein the planarization layer, the pixel defining layer, and the support layer are formed simultaneously using a same mask.

5. A method for manufacturing a display panel, comprising:

a step S10 of providing an array substrate, wherein a source/drain metal is disposed on the array substrate;

a step S20 of sequentially forming a planarization layer and a pixel defining layer on the array substrate, wherein the pixel defining layer comprises a plurality of pixel defining bodies that are spaced apart from each other, and a region located between any two adjacent pixel defining bodies constitutes a pixel area; and after forming the pixel defining layer, a step S30 of forming an anode layer in the pixel area, wherein an edge of the anode layer is attached to the pixel defining bodies;

wherein the anode layer comprises an upward protruding portion, and the upward protruding portion is located at a position where the anode layer is attached to the pixel defining layer.

6. The method for manufacturing the display panel according to claim 5, wherein the step S30 comprises:

forming an anode metal layer in the pixel area, and performing an exposure treatment, a developing treatment, and an etching treatment to the anode metal layer using a mask process in order to form the anode layer.

7. The method for manufacturing the display panel according to claim 5, wherein the pixel defining bodies comprise a slope at a side of the pixel defining bodies that is adjacent to the pixel area.

8. The method for manufacturing the display panel according to claim 5, wherein the step S20 further comprises forming a support layer on the pixel defining layer, and the planarization layer, the pixel defining layer, and the support layer all comprise a photoresist material; and wherein the planarization layer, the pixel defining layer, and the support layer are formed simultaneously using a same mask.

* * * * *